(12) United States Patent
Corbel et al.

(10) Patent No.: US 9,154,164 B2
(45) Date of Patent: Oct. 6, 2015

(54) INTERLEAVER AND DEVICE FOR SELECTING SERVICES, FOR A RADIOCOMMUNICATION NETWORK WITH LONG TIME INTERLEAVING AT THE LEVEL OF THE PHYSICAL LAYER

(75) Inventors: Erwan Corbel, Villenueve-Tolosane (FR); Olivier Courseille, Auzeville (FR); Christian Rigal, Portet sur Garonne (FR); Laurent Roullet, Bures (FR)

(73) Assignee: Alcatel Lucent, Boulogne-Billancourt (FR)

( * ) Notice: Subject to any disclaimer, the term of this patent is extended or adjusted under 35 U.S.C. 154(b) by 1378 days.

(21) Appl. No.: 12/666,709

(22) PCT Filed: May 26, 2008

(86) PCT No.: PCT/EP2008/056410
§ 371 (c)(1),
(2), (4) Date: Sep. 3, 2010

(87) PCT Pub. No.: WO2009/000603
PCT Pub. Date: Dec. 31, 2008

(65) Prior Publication Data
US 2011/0058624 A1    Mar. 10, 2011

(30) Foreign Application Priority Data
Jun. 26, 2007 (FR) .................................. 07 56031

(51) Int. Cl.
*H04B 7/216* (2006.01)
*H03M 13/27* (2006.01)

(52) U.S. Cl.
CPC .................... *H03M 13/27* (2013.01)

(58) Field of Classification Search
CPC ........................................................ H03M 13/27
USPC ............................................................ 370/342
See application file for complete search history.

(56) References Cited

U.S. PATENT DOCUMENTS

| 5,383,225 | A  | * | 1/1995  | Aguirre et al. ................ 375/354 |
|---|---|---|---|---|
| 2004/0085989 | A1 | * | 5/2004  | Boumendil et al. .......... 370/442 |
| 2005/0041670 | A1 | * | 2/2005  | Lin et al. .................. 370/395.21 |
| 2005/0251726 | A1 |   | 11/2005 | Takamura |
| 2006/0203893 | A1 | * | 9/2006  | Reznik et al. ................ 375/147 |
| 2007/0002871 | A1 | * | 1/2007  | Pekonen et al. ......... 370/395.42 |

(Continued)

FOREIGN PATENT DOCUMENTS

WO    WO 03/079601 A1    9/2003

OTHER PUBLICATIONS

International Search Report.

*Primary Examiner* — Shripal Khajuria
*Assistant Examiner* — Faisal Choudhury
(74) *Attorney, Agent, or Firm* — Fay Sharpe LLP

(57) ABSTRACT

An interleaver (ER) is dedicated to interleaving of interleaving units representing a selected number of services grouped into periodic frames within a long period time interleaving radio communication network. The said interleaver (ER) comprises processing means (MT1) responsible for decomposing each frame into a chosen number of group(s) of service of constant respective durations, and then for distributing the interleaving units of each group into so-called spreading time intervals of constant respective durations spaced apart within a time interleaving period according to a period equal to the period of the frames.

13 Claims, 2 Drawing Sheets

(56) References Cited

U.S. PATENT DOCUMENTS

2007/0019747 A1* 1/2007 Aldana ................. 375/260
2007/0253476 A1* 11/2007 Tirkkonen et al. ............ 375/230
2007/0258391 A1* 11/2007 Ochiai ................. 370/295
2007/0298836 A1* 12/2007 Yanover ................. 455/552.1
2010/0235706 A1* 9/2010 Eberlein et al. ............ 714/752

* cited by examiner

INTERLEAVER AND DEVICE FOR SELECTING SERVICES, FOR A RADIOCOMMUNICATION NETWORK WITH LONG TIME INTERLEAVING AT THE LEVEL OF THE PHYSICAL LAYER

BACKGROUND OF THE INVENTION

The invention concerns the transmission of multimedia type contents via a radio communication network implementing long period time interleaving at the level of the physical layer, and more particularly the time interleaving and deinterleaving, within such networks, of units sometimes referred to as interleaving units (or IU, in particular in DVB-SH and SDR type networks) defined based on multimedia content data packets to be transmitted.

The term "multimedia content" as used herein refers to sets of data of one and the same type, such as, for example, television or radio programs, data, or video files.

Furthermore, the term "radio communication network" as used herein shall mean any kind of satellite and/or terrestrial radio network implementing long period time interleaving at the level of the physical layer with a view to broadcast of multimedia content. This could for example be an SDR ("Satellite Digital Radio") network or a hybrid DVB-SH type network (DVB-H ("Digital Video Broadcasting—Handhelds") radio network type but adapted to S-band satellite links (approx. 2.20 GHz)—mobile television via satellite and terrestrial relays). Generally speaking, the invention concerns any network likely to suffer from significant signal fading.

As is known to a person skilled in the art, when certain radio (or Hertzian) signals propagate, they can become subject to multi-path interferences, attenuations and transient interceptions. This is frequently the case when signals propagate in a satellite channel. In order to limit the impact of interference, attenuations and interceptions, it is possible to implement, on the transmission side, a time period interleaving technique at the level of the physical layer, i.e. at the level of the content data packets to be transmitted. This is in fact what is done in DVB-SH type networks.

In the networks concerned by the invention, the length (or time constant) of the time interleaving at the level of the physical layer is (very) large as compared to the time constant used in the service layer. It can reach up to 10 seconds.

It is hereby reiterated that the TDMA (Time Division Multiple Access—time multiplexing) frames delivered by the service layer consist in a predefined number (e.g. 9) of bursts of MPEG type packets, which are respectively associated to services. These packets are encoded using an FEC (Forward Error Correction) type error correction technique, as well as in addition (possibly) MPE-FEC (Multi-Protocol Encapsulation—FEC), to generate codewords. Each burst of codewords is then broken down into interleaving units (IUs). The interleaving units of the different bursts of a frame are then distributed (or spread) by the interleaver over the entire time period interval occupied by a time interleaving period. The interleaving unit is the smallest set of bits (arising out of a content packet) that is processed by an interleaver.

Therefore, if it is desired to reconstitute, in a receiver terminal, all bursts of an interleaved frame, it is necessary to store in a an external memory all the interleaving units contained in a time interleaving period, which can require a greater amount of memory. By way of example and not of limitation, in the case of a type DVB-SH network using 16QAM (or respectively QPSK) modulation and a time interleaving period of 8 seconds, the receiver terminal must provide an external memory of approximately 256 MB (Megabytes) (respectively 128 MB) to store the data contained in a time interleaving instance. This need for a large capacity memory is a significant constraint for the manufacture of receiver terminals at a lower cost and complexity.

It would of course be possible to carry out the time interleaving on a layer located at a higher level than the physical layer. Such higher level layers do in fact enjoy the advantage of non-quantification of data bits and lower coding rates enabling time interleaving of a length similar to that obtained at the level of the physical layer, but requiring much less memory capacity (typically 10 times less). However, the FEC error correction technique as well as, additionally (possibly) MPE-FEC, which is applied before the time interleaving step, is substantially more effective when applied at the level of the physical layer, with an identical spectral efficiency. Moreover, interleaving at the level of the MPE-FEC layer, which is located above the physical layer, is distinctly less efficient than that of the said physical layer, and signaling of this MPE-FEC layer is no longer usable due to the interleaving time period of the physical layer.

The purpose of the invention is therefore to improve the situation.

SUMMARY OF THE INVENTION

To this end the invention proposes an interleaver of interleaving units (representing a chosen number of services grouped into periodic frames), for a radio communication network utilizing long time period time-interleaving.

Such interleaver is characterized by the fact that it comprises processing means responsible for decomposing each frame into a chosen number of group(s) of service of constant respective durations, and then for distributing the interleaving units of each group into time intervals, referred to as spreading time intervals, of constant respective durations and spaced apart within a time interleaving period according to a period equal to the period of the frames.

Preferably, the processing means are responsible for distributing the interleaving units of each group into so-called spreading time intervals whose respective durations are constant and small as compared to the period of the frames.

The invention also proposes a device for the selection of services, represented by interleaving units interleaved by means of an interleaver of the type described above for a radio communication network utilizing long time period time-interleaving.

This device is characterized by the fact that it comprises processing means synchronized in regard to the interleaver and responsible, in the case of selection of a group of services to be processed, for starting up periodically for at least the duration of each spreading time interval of the selected group, and therefore according to a period equal to the period of the frames in order to collect all interleaved interleaving units contained in the spreading time intervals of the selected group comprised in a time interleaving period.

The device of the invention may comprise other characteristics, which may be taken separately or in combination, in particular:

it may comprise memory means for storing interleaved interleaving units. In that case, its processing means can be responsible for storing, in the memory means and for each time interleaving period, all the interleaved interleaving units contained in the spreading time intervals of the selected group which are comprised in the time interleaving period in progress;

as a variant, it may comprise filtering means responsible for retaining, from among the collected interleaved interleaving units, those representing the services of the selected group;

it may comprise memory means for storing interleaving units. In that case, its filtering means can be responsible for storing, in the memory means and for each time interleaving period, those interleaved interleaving units selected in the spreading time intervals of the chosen group comprised in the time interleaving period in progress;

The invention also proposes a method for the interleaving of interleaving units for a radio communication network utilizing long time period time-interleaving.

The said interleaving method is characterized by the fact that it consists in decomposing each frame into a chosen number of group(S) of service of constant respective durations, and then in distributing the interleaving units of each group into time intervals referred to as spreading time intervals of constant respective durations spaced apart within a time interleaving period according to a period equal to the period of the frames.

The invention also proposes a method for deinterleaving interleaving units interleaved according to the method described above for a radio communication network utilizing long time period time-interleaving.

The said deinterleaving method is characterized by the fact that it consists in synchronizing deinterleaving with regard to interleaving and, in the case of the selection of a group of services to be deinterleaved, in working periodically for at least the duration of each spreading time interval of the selected group, and therefore according to a period equal to the period of the frames, in order to collect all interleaved interleaving units contained in the spreading time intervals of the selected group comprised in a period matching the time interleaving period, with a view to deinterleaving.

The said deinterleaving method according to the invention may comprise other characteristics, which may be taken separately or in combination, in particular:

at each period corresponding to a time interleaving period, it is possible to store all interleaved interleaving units contained in the spreading time intervals of the selected group which are comprised in the time interleaving period in progress, and at the end of the said time interleaving period in progress, the stored interleaved interleaving units are deinterleaved and then filtered;

as a variant, it is possible to retain, from among the collected interleaved interleaving units, those representing the services of the selected group;

at each period corresponding to a time interleaving period, it is possible to store the selected interleaved interleaving units retained in the spreading time intervals of the selected group which are comprised in the time period in progress corresponding to a time interleaving period, and at the end of said time period in progress corresponding to a time interleaving period), the stored interleaved interleaving units are filtered, and then deinterleaved.

Finally, the invention also proposes a computer program that may be loaded into a memory associated to a processor and comprises instructions for the implementation of a method as defined above when executed by the processor, as well as a data storage medium on which said program is stored.

DESCRIPTION OF THE DRAWINGS

Other characteristics and advantages of the invention will become apparent upon examining the detailed description below, and the attached drawings, wherein.

DETAILED DESCRIPTION

The attached drawings may serve not only to complete the invention, but also to contribute to its definition as necessary.

The purpose of the invention is to enable transmission of multimedia type contents to receiver terminals via a radio communication network implementing long time period time-interleaving at the level of the physical layer.

In the discussion below it is considered by way of example but not of limitation that the radio communication network is a DVB-SH type network, intended e.g. to broadcast television programs to mobile (or cellular) receiver terminals such a mobile phones by means of satellite(s) and also possibly terrestrial relays. However, the invention is not limited to radio communication networks of this type. Neither it is limited to receiver terminals of this type, or to multimedia contents of this type.

In fact, the invention concerns any type of communication network implementing long time period time-interleaving at the level of the physical layer and likely to suffer from significant signal fading, and more particularly SDR (Satellite Digital Radio) and DVB-SH type networks.

Furthermore, the invention concerns all types of radio communication terminals equipped with a multimedia content radio receiver having undergone long time period time-interleaving at the level of the physical layer. Therefore, it concerns in particular desktop or laptop computers and personal digital assistants (PDAs) with wave transmission based communication modules, servers potentially equipped with a multimedia content player, and any other type of multimedia content receiver that may be connected to a radio broadcast network and intended to feed multimedia contents broadcast to a multimedia content player or to storage means.

Finally, the invention concerns any type of multimedia content consisting of a set of data of one and the same type, and more particularly radio programs, data files and videos.

Figure 1:
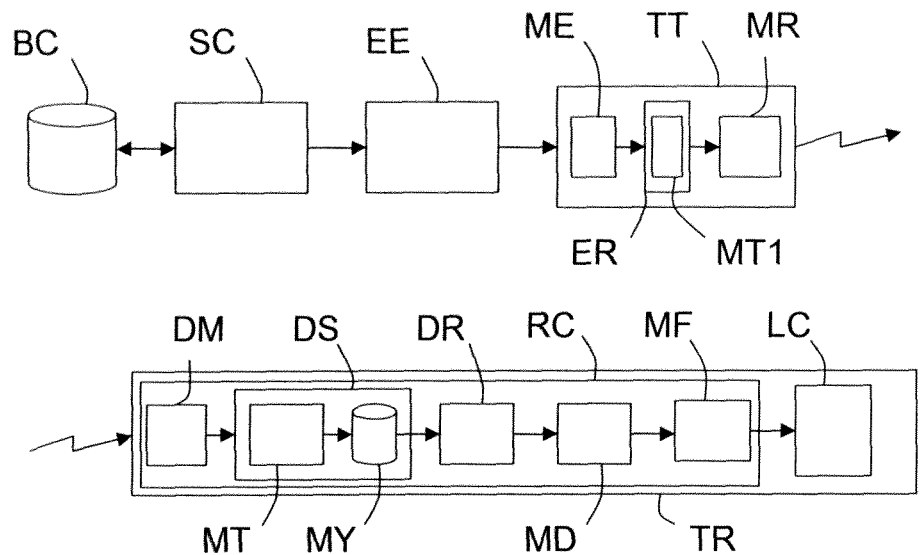
FIG. 1 illustrates, in a highly schematic and functional manner, a multimedia content transmission chain comprising an exemplary embodiment of an interleaver according to the invention and a first multimedia content receiver terminal including a first embodiment of a service selection device according to the invention.

FIG. 1 shows a transmission (broadcast) chain of multimedia contents between a multimedia content server SC and receiver terminals TR comprising (or embodied as) a multimedia content receiver RC, via an IP encapsulation equipment EE, a transmission terminal TT and a broadcast network (not shown, and in this case of the DVB-SH type).

It is hereby reiterated that a multimedia content server (or video encoder) SC is responsible for transforming multimedia contents into data sets, e.g. where such contents originate from a content database BC, then to incorporate such data sets into IP packets, in order to deliver, on output, continuous flows of IP packets intended for an IP encapsulation equipment EE.

The IP encapsulation equipment (or IPE for "IP Encapsulator") EE is responsible for encapsulating IP packets received in bursts in accordance with the transmission mode utilized by the broadcast network used. This transmission mode may for example be the TDMA (Time Division Multiple Access—time multiplexing) mode.

In this context, a "burst" shall be a set of packets, e.g. in MPEG format, constituting one or more services and defining part of one or more multimedia contents (in this case, TV programs).

The bursts (in this example, TDMA) are communicated by the IP encapsulation equipment EE to a transmission terminal TT of the broadcast network for broadcasting (after processing) to the receiver terminals TR. The sizes of the bursts associated to the different services are not necessarily constant over time. On the other hand, the bursts associated to, respectively, the different services are arranged within periodic frames TE of a period PT, as illustrated on the first line (L1) of FIG. 4 in the case of nine services.

A transmission terminal TT usually comprises at least an encoding module ME, a time interleaver ER, and a modulator MR.

Figure 4:
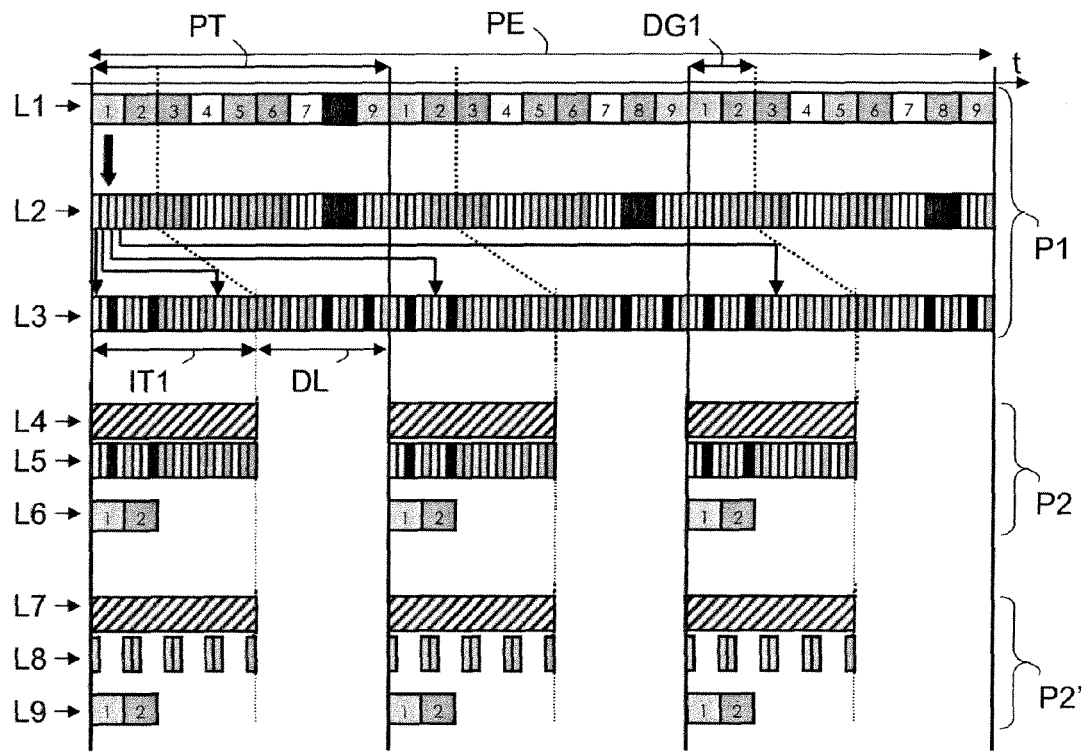
FIG. 4 illustrates, in a highly schematic manner, firstly, the consequences on frames (of nine successive bursts) of the implementation of the main steps of an interleaving method according to the invention, secondly, the consequences on the interleaving units interleaved by means of the interleaving method according to the invention of the implementation of the main steps of a first deinterleaving method according to the invention and the subsequent services filtering, and, thirdly, the consequences on the interleaving units interleaved by means of the interleaving method according to the invention of the implementation of the main steps of a second deinterleaving method according to the invention, incorporating service filtering. The axis marked "t" symbolizes time.

The encoding module ME is responsible for applying an error correction encoding scheme of the FEC type (insertion of redundancy) as well as (possibly) of the MPE-FEC type to the burst constituents (generally called Interleaving Units or IUs by persons skilled in the art), in order to deliver interleaving units that are always grouped according to the bursts they belong to, as illustrated on the second line (L2) of FIG. 4.

According to the invention, the time interleaver ER receives the interleaving units (which represent a chosen number of services grouped in periodic frames TE) and comprises a processing module MT1 responsible firstly for decomposing each TE frame into a chosen integer number Gi of groups of service(s) of respective constant durations DGi.

It is important to point out that even if it is ultimately the modulator that carries out the segmentation, the latter may/ must be signaled to it by the encapsulator, which, in turn, knows the outline of the services, which is not the case of the modulator, which generally operates at lower levels.

Figure 3:
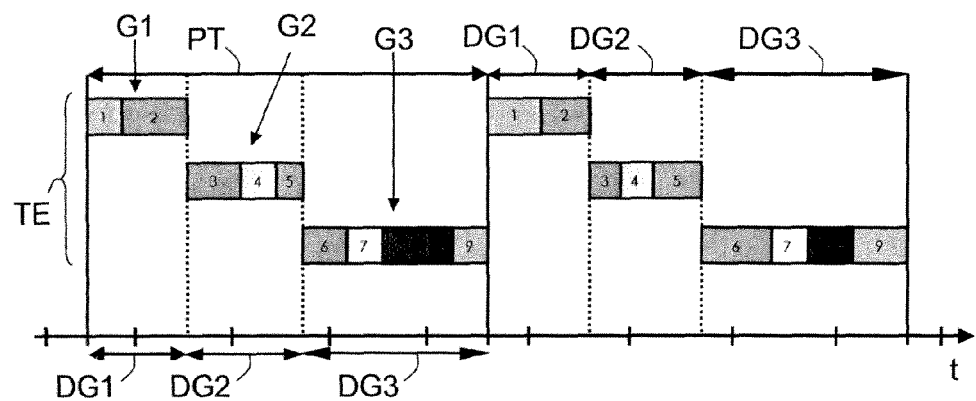
FIG. 3 illustrates, in a highly schematic manner, the decomposition in time (t) of two frames of successive bursts into three groups of services comprising, respectively, two, three and four services.

It is important to point out that the number of groups Gi is comprised between one and the number of services N (or bursts) of a frame TE. In other words, the index i is comprised between 1 and N. Therefore, the number of services (or bursts) of a group can be comprised between 1 and N. In FIG. 3 we have represented an example in which the processing module MT1 decomposes each periodic frame TE, of a period PT, into three groups G1 to G3 (i=1 to 3), with the first group G1 comprising the two services numbered 1 and 2, with the first group G2 comprising the three services numbered 3 to 5, and the third group G3 comprising the four services numbered 6 to 9.

As can be seen in FIG. 3, given by way of example but not of limitation, the time duration DGi of a group Gi is constant from one frame TE to another frame TE. In other words, the sum of the time durations of the services composing a group Gi of a frame TE is constant from one frame TE to another frame TE, but the respective time duration of the services that compose a group Gi may vary from one frame TE to the other. It should be borne in mind that such time durations can potentially be changed by reconfiguration.

It should be noted that preferably the interleaving units of each group Gi are distributed into spreading time intervals ITi whose respective durations DIi are small as compared to the period PT of the frames TE. In other terms, the duration DL that separates the end of one spreading time interval ITi (e.g. IT1) from the start of the following time spreading interval ITi, which is equal to the sum of the durations DIi' (i'≠i) of the other spreading time intervals ITi' comprised in a period PT, is preferably small by comparison to the duration DI1 of the time spreading interval ITi.

It should also be noted that in order to facilitate understanding of the invention, the duration DI1 of the time spreading interval IT1 has intentionally been inflated, and is therefore disproportionate as compared to the duration DL as represented.

It should further be noted that the processing module MT1 must be perfectly synchronized to the IP encapsulation equipment EE to ensure that the services layer and the physical layer are synchronized. Synchronization is preferably ensured by means of synchronization information transmitted through signaling (but, as a variant, the processing module MT1 could discover the configuration by its own devices). In fact, the principal issue is to signal the arrival of certain TE frame fractions so as to enable the synchronization of the interleaver ER in regard to those TE frame fractions.

Once the groups Gi of a frame TE have been formed, the processing module MT1 distributes (or interleaves) the interleaving units of each group Gi in time intervals ITi (referred to as spreading time intervals), whose respective durations DIi are constant and which are periodically spaced within a time interleaving period PE according to a period PI that is equal to the period PT of the frames TE. In other words, if each periodic frame TE is decomposed into three groups G1 to G3 of respective constant durations DGi and the period PE of time interleaving is equal to M×PT, then the interleaving units of the first group G1 are distributed over M time spreading intervals IT1 of a constant duration DI1 and periodically spaced out by a period PI (equal to PT), the interleaving units of the second group G2 are distributed over M time spreading intervals IT2 of a constant duration DI2 and periodically spaced out by a period PI (equal to PT), and the interleaving units of the third group G3 are distributed over M time spreading intervals IT3 of a constant duration DI3 and periodically spaced out by a period PI (equal to PT).

The third line (L3) of FIG. 4 represents, by way of example but not of limitation, a distribution of interleaving units of the first group G1 (consisting of services 1 and 2) of a frame TE in M=3 spreading time intervals IT1 of constant duration DI1 and periodically spaced out by a period PI (equal to PT) within a time interleaving period PE.

Any deterministic interleaving technique known to a person skilled in the art may be used, and more particularly the techniques known as "convolutive interleaving" and "block interleaving".

Once the processing module MT1 has distributed (or interleaved) the interleaving units of a frame TE within a time interleaving period PE, the interleaving process P1 (whose consequences are schematically represented on the first three lines (L1 to L3) of FIG. 4) is completed for that frame TE. The processing module MT1 communicates the interleaved interleaving units to the modulator MR for application of a chosen modulation, e.g. QPSK or 16QAM, before they are transmitted (broadcast) by waves to receiver terminals TR (or TR').

It should be noted that the interleaver ER according to the invention may be implemented in the form of electronic circuits, software (or computing) modules, or a combination of circuits and software.

Figure 2:
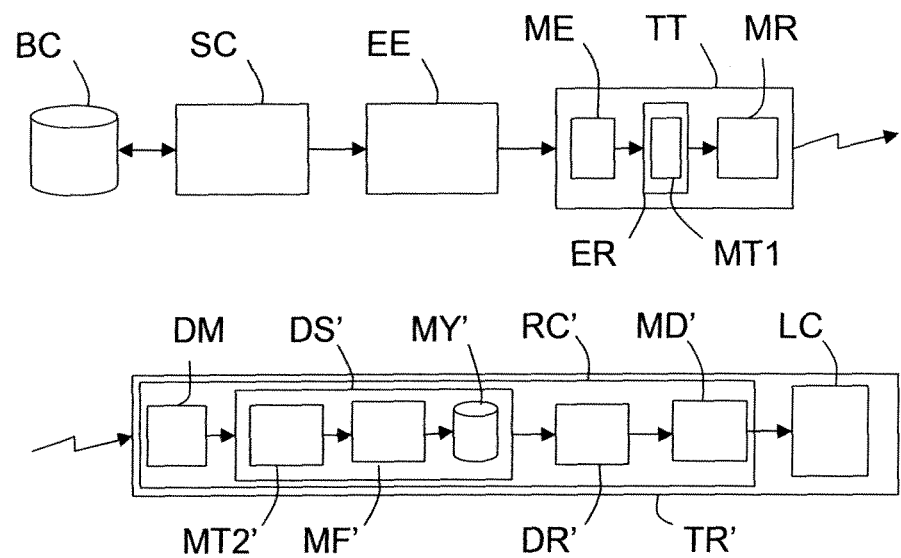
FIG. 2 illustrates, in a highly schematic and functional manner, a multimedia content transmission chain comprising an embodiment of an interleaver according to the invention and a second multimedia content receiver terminal including a second embodiment of a service selection device according to the invention.

As illustrated in the two embodiments in FIGS. 1 and 2, a receiving terminal TR (or TR') comprises a receiver of contents RC (or RC') which may feed a content player LC or else memory means (not shown), as for example a hard disk or a database.

The content receiver RC comprises, first of all, a demodulator DM responsible for demodulating the interleaved and modulated interleaving units according to the modulation technique used by the modulator MR of the transmission terminal TT. The output from the demodulator DR feeds the input of a services selection device DS (or DS') according to the invention.

A services selection device DS (or DS') comprises at least one processing module MT2 (or MT2') that is synchronized to the clock of the interleaver ER used to interleave the interleaving units.

Synchronization is ensured by means of synchronization (or service localization) information transmitted with the signaling, which shall preferably be subject to time interleaving. As the synchronization information define at least the duration of a time interleaving period PE, the duration of a frame TE, the respective durations DIi of the spreading time intervals ITi and the start of the first interleaved interleaving unit of the next period PE, the processing module MT2 can therefore easily get synchronized on the start of the next period PE, and determine the start of the first spreading time interval ITi of the chosen group Gi (contained in this next period PE) as compared to the start of the next period PE.

The processing module MT2 (or MT2') is responsible, when a group of service(s) Gi has been locally selected in order to be stored or used at least partially, for starting up ("ON mode") periodically for at least the duration DIi of each spreading time interval ITi of the selected group Gi, and therefore according to a period equal to the period PT of the initial frames TE (before interleaving). This enables battery savings.

In other words, the processing module MT2 (or MT2') is started up (activated) only periodically in order to collect only the interleaved interleaving units comprised in each spreading time interval ITi of the selected group Gi. It should be noted that in permanent operation the decoder also works on previously stored interleaving units. Thus, at each time interleaving period PE it collects all the interleaved interleaving units contained in the spreading time intervals ITi of the selected group Gi comprised in said period PE.

This is particularly advantageous because it very significantly reduces the number of interleaving units that need to be collected by the processing module MT2 (or MT2') during each time interleaving period PE to enable them to be deinterleaved.

The operating phases of the processing module MT2 when the chosen group of services is G1 (which matches the spreading time intervals IT1) have been schematically represented by means of hatched rectangles on the fourth (L4) and seventh lines (L7) of FIG. 4. In this case the operating period is substantially identical to the duration DG1 of each spreading time interval IT1. However, as previously indicated, this operating period could be longer by starting slightly before the beginning of each spreading time interval IT1 and/or ending slightly after the end of each spreading time interval IT1.

It will be easily understood by referring to the fifth line (L5) of FIG. 4 that the interleaved interleaving units, which are collected by the processing module MT2 (or MT2') in each spreading time interval ITi of the chosen group Gi, do not, generally, exclusively belong to the service(s) of the chosen group Gi. They are in fact interleaved with interleaving units belonging to the services of other groups Gi' (i'≠i). Therefore, two different embodiments may be foreseen for the device DS (or DS').

In a first embodiment, illustrated in FIG. 1, the device DS comprises e.g. a memory MY in which its processing module MT2 stores, for each time interleaving period PE, all the interleaved interleaving units contained in the spreading time intervals ITi of the selected group Gi comprised in the time interleaving period PE in progress, without filtering; this already renders it possible to significantly reduce the storage capacity of the memory MY as compared to that necessary in a content receiver of the prior art.

At the end of each time interleaving period PE, the deinterleaver DR extracts (or receives) from the memory MY the interleaved interleaving units collected and stored during the elapsed period PE, in order to proceed to their deinterleaving. The deinterleaving technique used here is the reverse of that used for interleaving in the interleaver ER. It is, for example, either convolutive or by blocks.

The (deinterleaved) interleaving units then feed a decoding module MD responsible for applying to them a technique that is the reverse of the error correction technique used by the encoding module ME. It is, for example, of a FEC type as well as, in addition, (possibly) MPE-FEC type.

The decoded and deinterleaved interleaving units then feed a filtering module MF responsible for selecting only those that define the service(s) of the chosen group Gi, thus to reconstitute the bursts (or services) initially contained in the M frames TE contained in a time interleaving period PE. The sixth line (L6) of FIG. 4 schematically represents the two bursts (or services 1 and 2) of the first group of services G1 that were initially contained in the three frames corresponding to a time interleaving period PE.

It should be noted that the fourth (L4) to sixth (L6) lines of FIG. 4 concretely represent the consequences on the interleaved interleaving units of the application of the first deinterleaving process P2 implemented by a content receiver RC of the type illustrated in FIG. 1.

Once the bursts (or services) of the chosen group Gi have been reconstituted, they can then be stored or used (read) by a content player LC, as illustrated in FIG. 1, without limitation.

In a second embodiment, illustrated in FIG. 2, the device DS' comprises for example a filtering module MF' on the output side of the processing module MT2'. The said filtering module MF' is therefore responsible for retaining, from among the interleaved interleaving units collected by the processing module MT2', those representing the services of the chosen group Gi.

To carry out such filtering, the filtering module MF' must possess information concerning the type of deterministic interleaving carried out and about the future frames TE. Such information is preferably contained in the signaling, just like the synchronization information. For example, if the filtering module MF' is signaled the start of the first interleaving unit of the chosen group of service(s) Gi, it is then able, by virtue of the knowledge of the deterministic interleaving function used, to determine the time positions of the other interleaving units of the said chosen group of service(s) Gi.

By means of such filtering, the filtering module MF' delivers, at its output, only the interleaved interleaving units collected by the processing module MT2' in each spreading time interval ITi of the selected group Gi. The eighth line (L8) of FIG. 4 represents the interleaved interleaving units filtered by the filtering module MF' in each spreading time interval IT1 associated to the first group G1 selected and contained in a time interleaving period PE.

The interleaved and filtered interleaving units contained in a time interleaving period PE are stored as and when they are filtered in a memory MY'. The number of interleaving units to be stored for a time interleaving period PE is thus very significantly reduced, which enables even further reduction of the storage capacity of the memory MY'.

At the end of each time interleaving period PE, the deinterleaver DR' extracts (or receives) from the memory MY' the interleaved and filtered interleaving units collected, filtered and stored during the elapsed period PE, in order to proceed to their deinterleaving. The deinterleaving technique used here is the reverse of that used for interleaving in the interleaver ER, but restricted to only the interleaving units of the chosen Gi group, which facilitates its application and enables reduction of the required computation capacities.

The (filtered and deinterleaved) interleaving units then feed a decoding module MD' responsible for applying to them a technique that is the reverse of the error correction technique used by the encoding module ME. It is, for example, of a FEC type as well as, in addition, (possibly) MPE-FEC type.

Then, the decoding module MD' reconstitutes the bursts (or services) initially contained in the M frames TE contained in a time interleaving period PE with the filtered, decoded and deinterleaved interleaving units.

The ninth line (L9) of FIG. 4 schematically represents the two bursts (or services 1 and 2) of the first group of services G1 that were initially contained in the three frames (M=3) TE of a time interleaving period PE.

It should be noted that the seventh (L7) to ninth (L9) lines of FIG. 4 concretely represent the consequences on the interleaved interleaving units of the application of the second deinterleaving process P2' implemented by a content receiver RC' of the type illustrated in FIG. 2.

Once the bursts (or services) of the chosen group Gi have been reconstituted, they can then be stored or used (read) by a content player LC, as illustrated in FIG. 1, without limitation.

It should be noted that the synchronization data and the potential information concerning the deterministic type of interleaving carried out on the future frames TE may for example be transmitted in what a person skilled in the art calls frame headers SF (or "Signaling Field") in the case of operation in TDM mode or in the number designating a super frame ("super frame number") in TPS in the case of operation in OFDM mode, or else in a SHIP ("SH frame Initialization Packet").

The service selection devices DS and DS' according to the invention may be implemented as electronic circuits, software (or computing) modules, or a combination of circuits and software.

The invention is not limited to the embodiments of the interleaver, the service selection device, the interleaving method and the deinterleaving method described above, which are only given by way of example; rather, it encompasses all variants that a person skilled in the art may envision within the framework of the claims set forth below.

The invention claimed is:

1. An apparatus for interleaving units representing a chosen number of services grouped into periodic frames in a radio communication network utilizing long time-period time interleaving, the apparatus comprising:
   a first processor configured to decompose one or more link layer frames into a chosen number of groups of services of constant respective durations, distribute interleaved units of the groups into spreading time intervals of constant respective durations and spaced apart within a time interleaving period equal to the sum of the group durations, wherein the sum of the group durations has a duration that is a constant and comprises a frame period;
   a second processor in a device configured to select services represented by interleaving units interleaved by the apparatus and synchronized in regard to said apparatus and configured to, in the event of selection of a group of services to be processed, start operation periodically during at least the duration of each spreading time interval of said chosen group, and according to a period equal to the period of the frames to collect interleaved units contained in the spreading time intervals of the chosen group comprised in a time interleaving period.

2. The apparatus according to claim 1, wherein said first processor is further configured to distribute the interleaved units of each group into spreading time intervals of constant respective durations, which are shorter than said frame period.

3. The device according to claim 1, further comprising memory configured to store interleaved units, and wherein said second processor is further configured to store, in said memory and for each time interleaving period, the interleaved units contained in the spreading time intervals of the chosen group that are comprised in the time interleaving period in progress.

4. The device according to claim 1, further comprising a filter configured to retain, from among the interleaved units collected, those representing the services of the chosen group.

5. Device according to claim 4, further comprising memory configured to store interleaved units, wherein said filter is further configured to store, in said memory and for each time interleaving period, the interleaved units retained in the spreading time intervals of the chosen group that are comprised in the time interleaving period in progress.

6. A method for interleaving interleaving-units representing a chosen number of services grouped into periodic frames for a radio communication network utilizing long time-period time interleaving, the method comprising: decomposing one or more link layer frames into a chosen number of groups of services of constant respective durations, distributing interleaving units of said groups into spreading time intervals of constant respective durations and spaced apart within a time interleaving period equal to the sum of the group durations, wherein the sum of the group durations has a duration that is a constant and comprises a frame period, deinterleaving interleaving-units by synchronizing deinterleaving in regard to said interleaving and, in the event of selection of a group of services to be deinterleaved, operating periodically during at least the duration of each spreading time interval of said chosen group and according to a period equal to the period of the frames to collect interleaved interleaving units contained in the spreading time intervals of the chosen group comprised in a period corresponding to a time interleaving period with a view to deinterleaving.

7. The method according to claim 6, further comprising: storing, at a period corresponding to a time interleaving period, interleaved interleaving units contained in the spreading time intervals of the chosen group comprised in the time interleaving period in progress, and at the end of said time interleaving period in progress the interleaved and stored interleaving units are deinterleaved, and then filtered.

8. The method according to claim 6, wherein, from among the interleaved interleaving units collected, those representing the services of the chosen group are retained.

9. The method according to claim 8, further comprising: storing, at a period corresponding to a time interleaving period, the interleaved interleaving units retained in the spreading time intervals of the chosen group comprised in the period in progress corresponding to a time interleaving period, and at the end of said period in progress corresponding to a time interleaving period, the interleaved and stored interleaving units are filtered, and then deinterleaved.

10. A non-transitory computer-usable data carrier storing instructions that, when executed by a computer, cause the computer to perform a method of interleaving interleaving-units representing a chosen number of services grouped into periodic frames for a radio communication network utilizing long time-period time interleaving, wherein the method comprises: decomposing one or more link layer frames into a chosen number of groups of services of constant respective durations, distributing the interleaving units of said groups into spreading time intervals of constant respective durations and spaced apart within a time interleaving period equal to the sum of the group durations, wherein the sum of the group durations has a duration that is a constant and comprises a frame period, deinterleaving interleaving-units by synchronizing deinterleaving in regard to said interleaving and, in the event of selection of a group of services to be deinterleaved, operating periodically during at least the duration of each spreading time interval of said chosen group and according to a period equal to the period of the frames to collect interleaved interleaving units contained in the spreading time intervals of the chosen group comprised in a period corresponding to a time interleaving period with a view to deinterleaving.

11. The non-transitory computer-usable data carrier of claim 10, wherein deinterleaving interleaving-units further comprises: storing, at a period corresponding to a time interleaving period, interleaved interleaving units contained in the spreading time intervals of the chosen group comprised in the time interleaving period in progress, and at the end of said time interleaving period in progress the interleaved and stored interleaving units are deinterleaved, and then filtered.

12. The non-transitory computer-usable data carrier of claim 10, wherein from among the interleaved interleaving units collected, those representing the services of the chosen group are retained.

13. The non-transitory computer-usable data carrier of claim 10, wherein deinterleaving interleaving-units further comprises: storing, at a period corresponding to a time interleaving period, the interleaved interleaving units retained in the spreading time intervals of the chosen group comprised in the period in progress corresponding to a time interleaving period, and at the end of said period in progress corresponding to a time interleaving period, the interleaved and stored interleaving units are filtered, and then deinterleaved.

* * * * *